United States Patent [19]

Ruckl

[11] 4,118,288
[45] Oct. 3, 1978

[54] METHOD OF PRODUCING A PERFORATED METAL FOIL, ESPECIALLY FOR SCREEN PRINTING

[75] Inventor: Siegfried Rückl, Kufstein, Austria

[73] Assignee: Schablonentechnik Kufstein GmbH, Kufstein, Austria

[21] Appl. No.: 781,063

[22] Filed: Mar. 24, 1977

[30] Foreign Application Priority Data

Mar. 29, 1976 [AT] Austria ................. 2283/76

[51] Int. Cl.² .................... C25D 1/08; C25D 1/20
[52] U.S. Cl. ................... 204/11; 96/35.1; 204/24
[58] Field of Search ............ 204/11, 24; 96/35.1, 96/36.2

[56] References Cited

U.S. PATENT DOCUMENTS

| | | | |
|---|---|---|---|
| 2,225,734 | 12/1940 | Beebe et al. ............... | 204/11 |
| 3,763,030 | 10/1973 | Zimmer ..................... | 204/11 |
| 3,953,309 | 4/1976 | Gilano et al. ................ | 96/35.1 |
| 3,976,524 | 8/1976 | Feng ......................... | 96/36.2 |
| 4,022,932 | 5/1977 | Feng ......................... | 96/36.2 |

Primary Examiner—T. M. Tufariello
Attorney, Agent, or Firm—Montague & Ross

[57] ABSTRACT

A method of making a perforated metal foil, especially for screen printing, comprises applying to a metallic surface a photosensitive layer, exposing the photosensitive layer through a screen pattern, developing the exposed photosensitive layer to remove portions surrounding dots of the photosensitive material, and electrodepositing a metal upon the surface in the region surrounding the dots. Prior to or during a galvanic deposition of the screen metal on the surface, the dots of photosensitive material are swelled so that the tendency of the perforation boundaries to be encrusted with metal is reduced and the perforations resulting in the screen have substantially the same cross sections and sizes as the dots of the photosensitive material.

15 Claims, 11 Drawing Figures

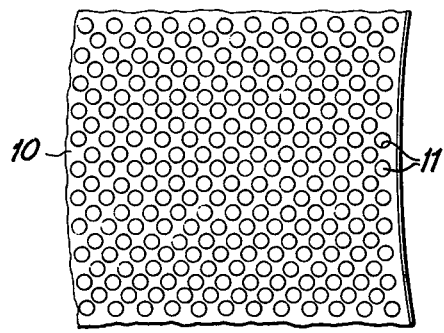
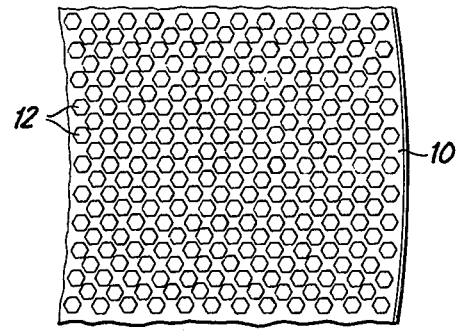
FIG. 1  FIG. 2
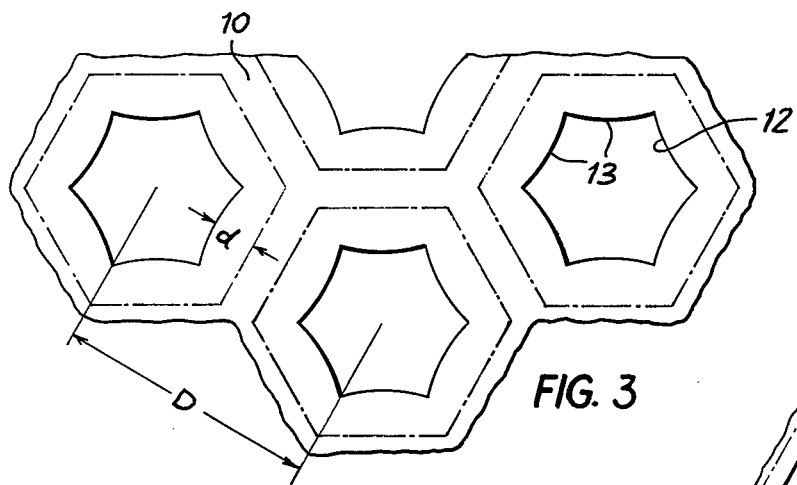
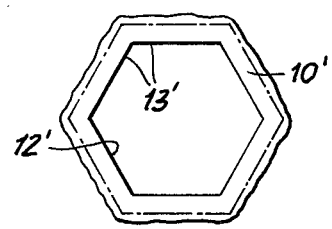
FIG. 3  FIG. 4
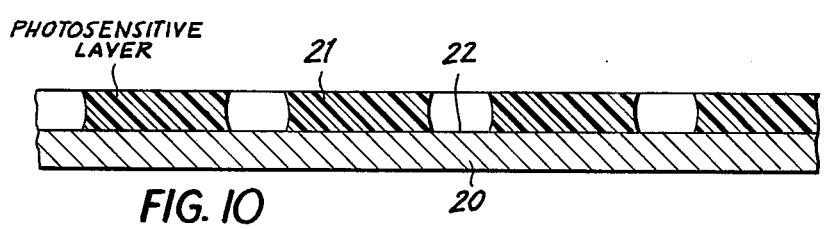
FIG. 10
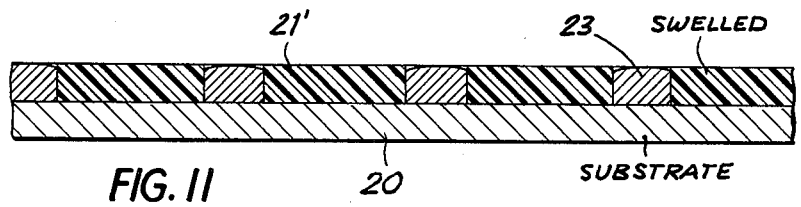
FIG. 11

METHOD OF PRODUCING A PERFORATED METAL FOIL, ESPECIALLY FOR SCREEN PRINTING

FIELD OF THE INVENTION

The present invention relates to a process for making a metal foil having a perforation pattern or raster, especially as screen-printing elements for carpet-printing drums and the like.

BACKGROUND OF THE INVENTION

Perforated screens for the pressure screen printing of carpets and the like, wherein the screens are constituted as drums with patterns of perforation through which the dyestuff is forced under pressure onto the carpet, have been made heretofore by galvanic techniques.

So-called printing screens have generally been produced heretofore by coating a metal cylinder or substrate with a photosensitive lacquer layer, drying the lacquer layer and exposing that layer through a film having a pattern corresponding to the desired perforation pattern or raster. After the film has been exposed, the photosensitive layer is developed so that the portions of the photosensitive material surrounding an array of dots corresponding to the perofration pattern are removed to expose the substrate drum surface. Metal is then galvanically deposited, i.e. electroplated, onto the drum around the dots of the retained photosensitive material so that, when the deposited metal body or screen is removed from the drum, perforations remain corresponding to the locations of the dots.

In practice it has been found that the openings in the screen are reduced, with reference to the dot pattern of the film and to the dots of photosensitive material left upon the substrate drum, because of encrustation resulting from the electroplating process. In other words, electroplated metal does not deposit strictly perpendicularly onto the substrate drum but also grows toward the centers of the openings or perforations which are intended to be defined by the dots of photosensitive material retained on the substrate drum.

It has also been found that the extent of encrustation, i.e. the extent to which the electroplated metal grows toward the center of the opening, increases with the thickness of the deposited metal and, therefore, the thickness of the printing screen. Thus it is only possible to ensure a cross section of the openings in the screen which approximately corresponds to the cross section of the dots around which the metal is electrodeposited when the screen formed from this metal is relatively thin.

In pressure printing, i.e. where the dyestuff is to be forced through the dot-pattern screen onto, for example, a carpet, the thinness of the screen is determined by its ability to withstand the elevated printing pressures which are employed. In other words, the pressure-printing requirements limit the degree to which the thickness of the screen can be minimized. It has been the practice heretofore, therefore, to accept a reduction in the cross section and size of the perforations, resulting from the boundary growth of metal during electroplating, when relatively thick screens are to be made, i.e. when the thickness of the screen is sufficient for pressure-screen printing as is necessary in the printing of carpet materials with dyestuffs.

OBJECTS OF THE INVENTION

It is an object of the present invention to provide an improved process for making a screen in which the aforementioned disadvantages are obviated.

It is another object of the invention to provide a process for making a screen, especially a pressure-printing screen for carpet-printing and like screen printing machines, wherein a screen of considerable thickness can be made with perforations true to the perforation pattern of a film or other template.

It is also an object of the invention to provide an improved method of making a high-resolution, relatively thick screen for screen-printing purposes in the pressure screen printing of carpets and the like.

SUMMARY OF THE INVENTION

These objects and others which will become apparent hereinafter are attained, in accordance with the present invention, in a method of making a metal perforated screen for the screen-printing of carpets and the like by pressure-screen-printing techniques, which comprises applying a photosensitive layer to a metallic substrate, exposing the photosensitive layer through an optical mask such as a template or film containing a dot pattern, developing the photosensitive layer to remove photosensitive material around the dots of the exposed pattern, and electroplating a metal onto the substrate surface around the dots of photosensitive material, these dots being swelled — in a manner more fully described hereinafter — either during the electrodeposition process or prior thereto.

I have found, quite surprisingly, that, by the addition of the aforementioned swelling step to the process, the diameters of the openings of the resulting screen are approximately equal to the diameter of the pattern points or dots of the film. In other words, any encrustation of the edges of the perforations occurring during galvanic deposition is compensated by the swelling so that the resulting perforations have configurations, cross sections, and other dimensions corresponding to those of the dot pattern of the original film through which the photosensitive layer is exposed. The galvanic deposition or electroplating can take place during the swelling process or thereafter.

As a result of this surprising phenomenon, it is possible to deposit metal layers of considerable thickness for pressure-screen printing drums, which is desirable for a number of reasons. Firstly, because of the greater thickness of the drum, i.e. the screen, it is possible to use very high printing pressures without distorting the drum. Secondly, because the perforation configurations and dimensions correspond precisely to the configurations and dimensions of the original pattern, very fine rasters can be made, thereby improving the resolution of the screen printing and further increasing the transfer of dyestuff to the carpet so that the speed of printing can be very high.

The color wedge which can be achieved with the printing screens of the present invention is substantially greater than has been obtainable heretofore. With my improved pressure-printing screen, moreover, the penetration of dyestuff through the screen and into the carpet material against which it is pressed is reduced or eliminated since far more dyestuff can be displaced through the openings in the screen than with screens made by conventional processes differing from the present process only by the omission of the swelling step.

The screens of the present invention are particularly useful in the printing, patterning or coloring of carpet materials since the resolution and fineness of the rasters which can be provided are far greater, up to about four times or more, than those of conventional printing screens.

Especially in carpet printing it is of considerable significance that the wall thickness of the pressure-printing screen can be increased. This is because the carpet printing normally takes place under higher pressure than is used for the printing of other fabrics.

Another surprising advantage of the present invention is that the current intensity for the electroplating or galvanic deposition of the metal can be reduced from about half to one quarter of the usual current intensity so that the perforations can be bounded by relatively thin webs. It should be noted that, when the conventional process is employed without the swelling step, current amplitudes of two to four times those required for the process according to my present invention must be used to get effective development of the webs between perforations.

The system of the present invention can be used with both positive and negative photosensitive layers although best results are obtained with positive photosensitive layers which can include, for example, benzenediazonium compounds, orthoquinonediazo compounds and the like in a resin. Such positive layers are well known in the art of forming printing screens. The thickness of the photosensitive layer should be of the order of 6 microns, i.e. 0.006 mm. This of course is a preferred thickness and the actual thickness can range from 0.002 to 0.010 mm without difficulty.

The following tables show the results obtained with different rasters in terms of improved dyestuff permeability and improved perforation diameter which can be obtained with the system of the present invention in comparison with systems carried out without the swelling step. In the two cases compared, the screens were produced in identical ways, i.e. with the electrodeposition of nickel from corresponding baths, although the current density of my improved system (including the swelling step) was approximately on third of the current density of the earlier system. The screens were made using the same raster negative film. Unless otherwise indicated, all dimensions are in millimeters.

TABLE I

|  | Conventional | New |
| --- | --- | --- |
| Raster | 32 | 32 |
| Division | 0.3125 | 0.3125 |
| Perforation Diameter | 0.09 | 0.20 |
| Web Width | 0.22 | 0.112 |
| Wall Thickness | 0.06 | 0.06 |
| Dyestuff Permeability | 6.56% | 41.08% |

TABLE II

|  | Conventional | New |
| --- | --- | --- |
| Raster | 40 | 40 |
| Division | 0.25 | 0.25 |
| Perforation Diameter | 0.07 | 0.18 |
| Web Width | 0.18 | 0.07 |
| Wall Thickness | 0.08 | 0.16 |
| Dyestuff Permeability | 7.8% | 51.8% |

TABLE III

|  | Conventional | New |
| --- | --- | --- |
| Raster | 16 | 16 |
| Division | 0.62 | 0.625 |

TABLE III-continued

|  | Conventional | New |
| --- | --- | --- |
| Perforation Diameter | 0.34 | 0.50 |
| Web Width | 0.28 | 0.125 |
| Wall Thickness | 0.13 | 0.18 |
| Dyestuff Permeability | 30% | 64% |

The swelling of the residual isolated portions or dots of the developed photosensitive layer, to decrease the intervening interstices, can be brought about by contacting that layer with moisture preferably after increasing the porosity of these residual portions by an afterexposure as described below. There are several ways in which the swelling can be effected.

After the selective exposure through an optical mask, the photosensitive layer can be developed in the usual manner. In the case of a positive photosensitive layer, the portions exposed to light are photochemically decomposed and are washed away with an aqueous alkaline solution. The remaining bodies of photosensitive material, i.e. the dots, can be swelled by exposure to water vapor preferably at a temperature between 50° and 60° C. (inclusive) for periods of about 5 to 7 minutes.

With negative photosensitive layers, it is possible to use a solvent vapor instead of water vapor. Alternatively, the photosensitive layer can be immersed in the solvent. The vapor treatment with solvent vapor can also be effected with positive photosensitive layers.

After vapor treatment or immersion of the photosensitive layer, galvanic (electroplating) deposition of the screen metal can be effected.

Another possible way of swelling the photosensitive layer is by introducing the photosensitive layer into a controlled environment in a vessel maintained at a relative humidity of 80 to 90% and a temperature of 20° to 50° C. for a suitable period.

The photosensitive layer can, after development, also be contacted or coated with a moisture-containing layer. Suitable moisture-containing layers include gelatin, which can be washed away after two to six hours with water. Instead of gelatin, other hydrophilic and moisture-releasing substances such as glycerine, polyvinyl alcohol and polyvinyl acetate can be used.

Another possible way of swelling the photosensitive layer according to the invention is to include in the photosensitive material a moisture-activated expanding (blowing) agent such as phenylhydrazine or polyvinyl alcohol. It is also possible to use heat-activated expanding agents, for example urea compounds, usually in combination with sodium nitrate, hydrogen peroxide, sodium bicarbonate or sublimatable coloring agents.

After development of the photosensitive layer, the remaining bodies or dots can be afterexposed, i.e. illuminated to split off gas molecules such as nitrogen. The result is a porous structure which is accompanied by an expansion or swelling of the dots. These dots or bodies of the photosensitive material can then be contacted with moisture. The afterexposure or illumination is most advantageously effected with a light intensity which is approximately half the intensity of the normal or original exposure. Obviously, no optical mask is required for this purpose.

Finally, it is also possible to deposit the photosensitive layer on a substrate which is moistened by water or another swelling agent, e.g. trichloroethane. For example, the substrate may be wetted with trichloroethane and then coated with the photosensitive layer. In this technique it is advantageous to mix water with the trichloroethane which is used to treat the surface upon which the photosensitive layer is deposited. The photosensitive layer is then deposited on the treated substrate and picks up moisture therefrom in the swelling operation.

The invention, of course, is not only applicable to the formation of pressure-screen drums for printing as described but may be used, for example, to form shearing screens for dry razors and for the fabrication of printed circuits.

The degree of swelling of the photosensitive layer can be controlled within a wide range according to the desired purpose, depending, for example, on the photosensitive material used. In all cases, however, the degree of swelling should be 10 or more times the original thickness of the photosensitive layer. The present method may also be employed for the production of varnish patterns for templates.

BRIEF DESCRIPTION OF THE DRAWING

The above and other objects, features and advantages of the present invention will become readily apparent from the following description, reference being made to the accompanying drawing in which:

FIG. 1 is a diagrammatic front-elevational view of a portion of a screen made in accordance with the present invention;

FIG. 2 is a diagrammatic elevational view of a rear portion of this screen;

FIG. 3 is a diagrammatic plan view illustrating the problem with the prior-art technique;

FIG. 4 is a view corresponding to FIG. 3 but diagrammatically illustrating the improvement achieved with the present invention;

FIGS. 10 and 11 are cross-sectional views illustrating the principles of the present invention.

SPECIFIC DESCRIPTION

In FIG 1, I have shown an electrodeposited screen 10 which is provided with an array of closely spaced openings 11 which are seen to be circular on the front side of the screen and, as can be noted from FIG. 2, are of hexagonal cross-section as shown at 12 on the rear side of the screen.

Figure 5:
FIG. 5 is a photomicrograph of a conventionally produced screen.
Figure 9:
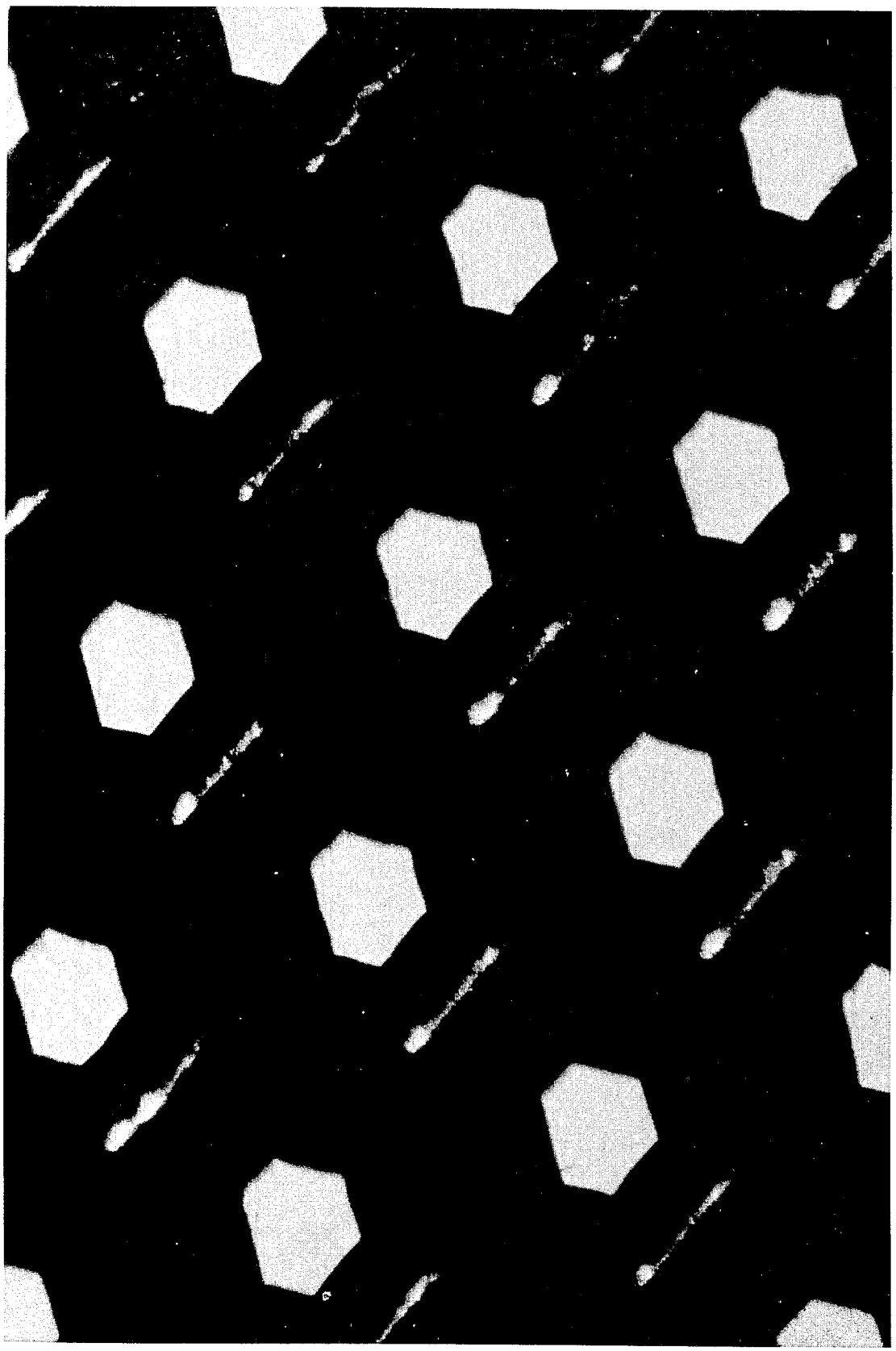
FIG. 9 is a photomicrograph of the rear of a conventional screen.

When a screen of this type is produced by conventional electrodeposition onto a developed photosensitive dot array after developing of the latter, without swelling in accordance with the principles of the present invention, the openings 12 are smaller than the openings in the master which are represented in FIG. 3 by dot-dash lines. The screen thus has encrustations as shown at 13 along the sides of the hexagon which obstruct the opening and, in spite of a large center-to-center distance D, reduce the effective cross-section of the screen. The encrustations have the width $d$ as illustrated in FIG. 3. In a conventional screen of this type, also shown in FIG. 9 and in the photomicrograph of FIG. 5, the opening cross-section can be only 7–15% of the total area of the screen.

Figure 6:
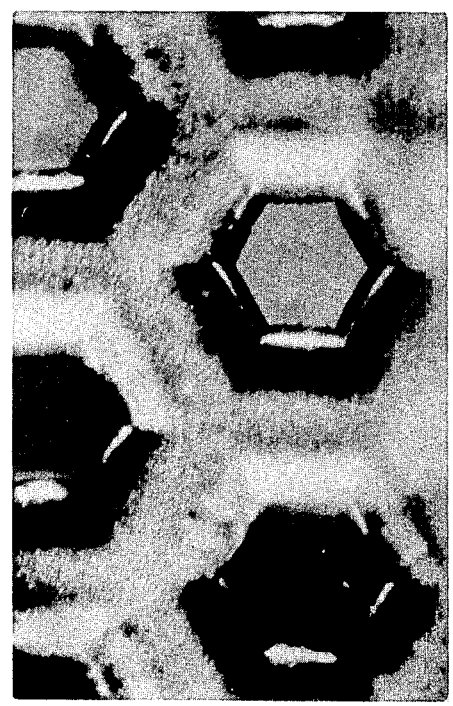
FIG. 6 is a photomicrograph of a screen produced in accordance with the present invention, on a slightly smaller scale.
Figure 7:
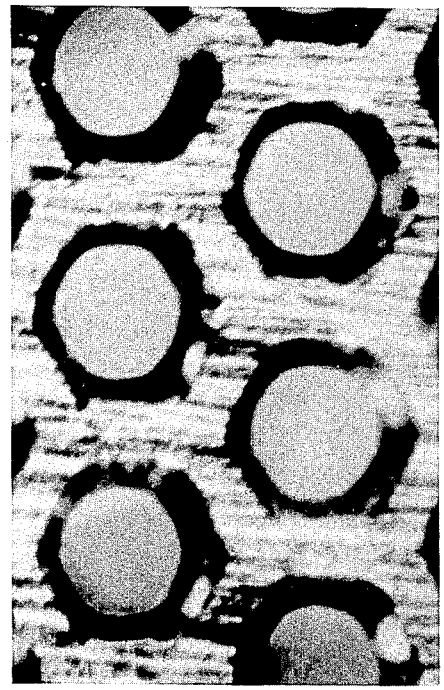
FIG. 7 is a photomicrograph of the front of the latter screen.
Figure 8:
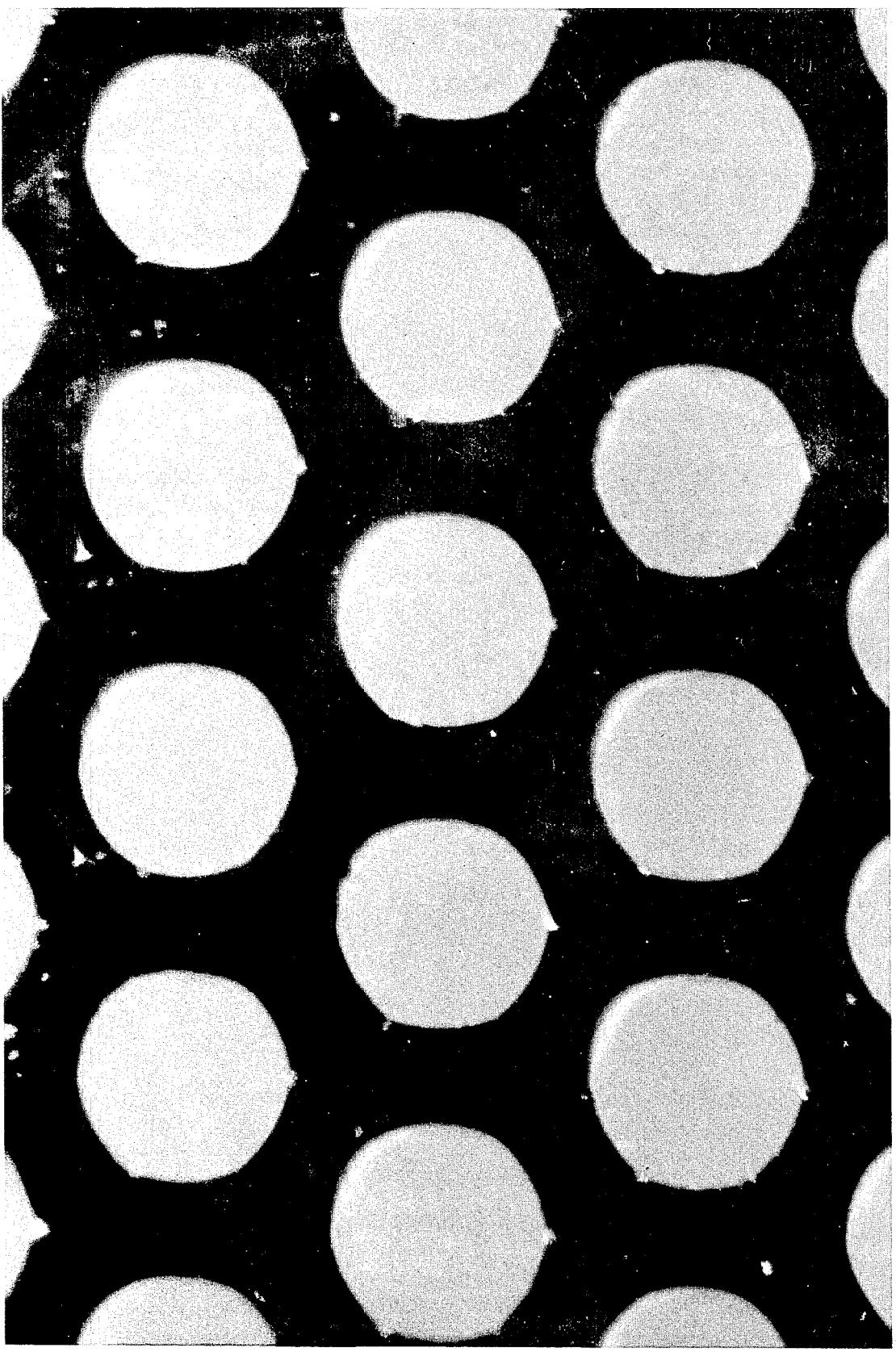
FIG. 8 is a photomicrograph of the front of the screen produced in accordance with the present invention.

With the system of the present invention, in which swelling is used, the hexagonal opening 12′ (FIG. 4) has substantially linear sides 13′ without any significant encrustation, the opening 12′ conforming more closely to the dot-dash outline. The screen 10′, also illustrated in FIGS. 6, 7 and 8, has been found in practice to have an openness of, say, 52%, i.e. the open cross section can correspond to 52% of the total area of the screen.

The process of the present invention has been illustrated diagrammatically in FIGS. 10 and 11. After the exposed photosensitive layer is developed, as shown in FIG. 10, dots 21 of the fixed photosensitive material remain upon the metal substrate 20 and define lands 22 between them upon which a coherent grid of electrodeposited material 23 (FIG. 11) can be formed. Because of the swelling action, the dots 21′ are expanded in comparison with the dots 21 of FIG. 10. This is the effect which permits screens of greater opening area and less encrustation to be produced.

SPECIFIC EXAMPLE

A screen is made in accordance with the present invention upon a cylindrical nickel cylinder which has a length of 2 meters and a diameter of 300 mm. In practice, the diameter of the nickel cylinder can range between 100 mm and 1000 mm while its length can range between 500 mm and 6000 mm.

The photosensitive layer, of a type conventional in the formation of electrodeposited screens, usually a photosensitive synthetic resin, is deposited to a thickness of 0.002–0.2 mm and is here specifically assumed to be 0.08 mm. The photosensitive layer is exposed through a matrix having a hexagonal dot pattern with a center-to-center spacing of 2 mm, projecting a pattern of hexagonal dots upon the photosensitive layer with a center-to-center distance of 0.08 mm corresponding to the thickness of the photosensitive layer. The dots have a diameter, measured across two sides, of about 0.04 mm. In general, this distance is 0.4 to 0.7 times the center-to-center distance and the thickness of the photosensitive layer.

The cylinder is illuminated with a power of about 8000 watts over a total exposure period of about five minutes, with rotation of the cylinder and line-by-line exposure of the dot pattern thereof.

The exposed photosensitive layer is then developed by washing away the exposed portions in a 0.8 to 5% aqueous sodium hydroxide solution and the resulting dots are permitted to swell in 100% humidity until the dot perimeter has increased by 700 to 1100%. As noted above, the rate of moisture absorption and therefore of swelling is enhanced with an afterexposure of the developed layer with a fraction of the original luminous intensity.

Electrodeposition of the metal is then carried out with a spacing of the electroplating electrode from the substrate by 12 to 18 cm to deposit a metal layer of a thickness of 0.06 to 0.4 mm. The electrodeposition current density is 5 amperes per $dm^2$ and the electrolyte is an aqueous solution of sodium phosphate. I have found that, with the swelling of the dots pursuant to my present invention, the open cross section of the screen can be about 52% of the total cross-sectional area, whereas without the swelling step the open cross section corresponds to 7 to 15% of the total screen cross section.

I claim:

1. A process for producing a coherent perforated metal foil which comprises the steps of:
    applying a photosensitive layer to a metallic substrate;
    selectively exposing said photosensitive layer to luminous energy through an optical mask;
    developing the exposed photosensitive layer to leave isolated portions of photosensitive material, corresponding to the perforation to be formed in said foil, on said substrate;
    increasing the porosity of said isolated portions;
    swelling said isolated portions by contacting same with moisture to reduce the intervening interstices;
    galvanically depositing metal on said substrate in said interstices; and
    separating the resulting metallic structure from said substrate and from said isolated portions.

2. A process as defined in claim 1 wherein the step of increasing the porosity of said isolated portions is performed by illuminating same with a fraction of the luminous intensity of the preceding selective exposure.

3. A process as defined in claim 2 wherein the intensity of illumination is substantially half that of said selective exposure.

4. A process as defined in claim 1 wherein the step of contacting said isolated portions with moisture is performed by juxtaposing same with a moist solid body.

5. A process as defined in claim 4 wherein said moist solid body is said substrate.

6. A process as defined in claim 5 wherein said substrate is moistened with a liquid prior to application of said photosensitive layer thereto.

7. A process as defined in claim 6 wherein said liquid is trichloroethane.

8. A process as defined in claim 1 wherein the step of contacting said isolated portions with moisture is performed by juxtaposing same with moisture-releasing layer.

9. A process as defined in claim 8 wherein said moisture-releasing layer consists of gelatine.

10. A process as defined in claim 8 wherein said moisture-releasing layer consists of glycerine.

11. A process as defined in claim 8 wherein said moisture-releasing layer consists of polyvinyl alcohol.

12. A process as defined in claim 8 wherein said moisture-releasing layer consists of polyvinyl acetate.

13. The process defined in claim 1 wherein said photosensitive layer contains an expanding agent.

14. The process defined in claim 13 wherein said expanding agent is a moisture-activated substance.

15. The process defined in claim 13 wherein said expanding agent is a thermally activatable substance.

* * * * *